(12) United States Patent
Inaba et al.

(10) Patent No.: US 7,597,465 B2
(45) Date of Patent: Oct. 6, 2009

(54) PROJECTOR-TYPE LAMP UNIT FOR VEHICLE

(75) Inventors: Tetsuaki Inaba, Shizuoka (JP); Shigeyuki Watanabe, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 11/408,046

(22) Filed: Apr. 21, 2006

(65) Prior Publication Data

US 2006/0239022 A1    Oct. 26, 2006

(30) Foreign Application Priority Data

Apr. 21, 2005    (JP)    ............................ P.2005-124108

(51) Int. Cl.
*F21S 8/10*    (2006.01)
(52) U.S. Cl. .................. 362/538; 362/507; 362/296.06; 362/296.07; 362/346
(58) Field of Classification Search ................. 362/538, 362/507, 545, 518, 539, 296.06, 296.07, 362/311.01, 328, 329, 346
See application file for complete search history.

(56) References Cited

U.S. PATENT DOCUMENTS

| | | | | | |
|---|---|---|---|---|---|
| 1,395,699 | A | * | 11/1921 | Brake | ........................... 362/538 |
| 1,469,690 | A | * | 10/1923 | Smith | ........................... 362/211 |
| 1,694,593 | A | * | 12/1928 | Graf | ............................ 362/299 |
| 1,928,431 | A | * | 9/1933 | Morshead et al. | ............ 362/538 |
| 5,305,189 | A | * | 4/1994 | Sekiguchi | .................... 362/538 |
| 6,607,295 | B2 | * | 8/2003 | Hayakawa | ................... 362/517 |
| 6,945,672 | B2 | * | 9/2005 | Du et al. | ....................... 362/241 |
| 7,048,412 | B2 | * | 5/2006 | Martin et al. | ................ 362/247 |
| 7,156,544 | B2 | * | 1/2007 | Ishida | ......................... 362/538 |

FOREIGN PATENT DOCUMENTS

JP    2003-317513 A    11/2003

* cited by examiner

*Primary Examiner*—Sharon E Payne
(74) *Attorney, Agent, or Firm*—Sughrue Mion, PLLC

(57) ABSTRACT

A projector-type lamp unit including a first reflecting surface for reflecting and condensing light emitted from an LED toward a projection lens disposed in the forward direction than the LED, a second reflecting surface for reflecting a part of the reflected light from the first reflecting surface toward the projection lens, and a design portion disposed between the second reflecting surface and the projection lens and continuing to the second reflecting surface. The first reflecting surface, the second reflecting surface and the design portion form a one-piece reflection mirror unit.

8 Claims, 15 Drawing Sheets

FIG. 11
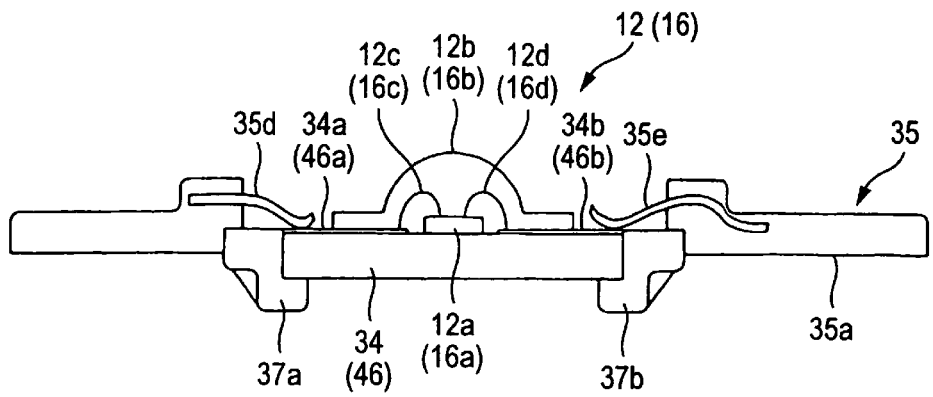
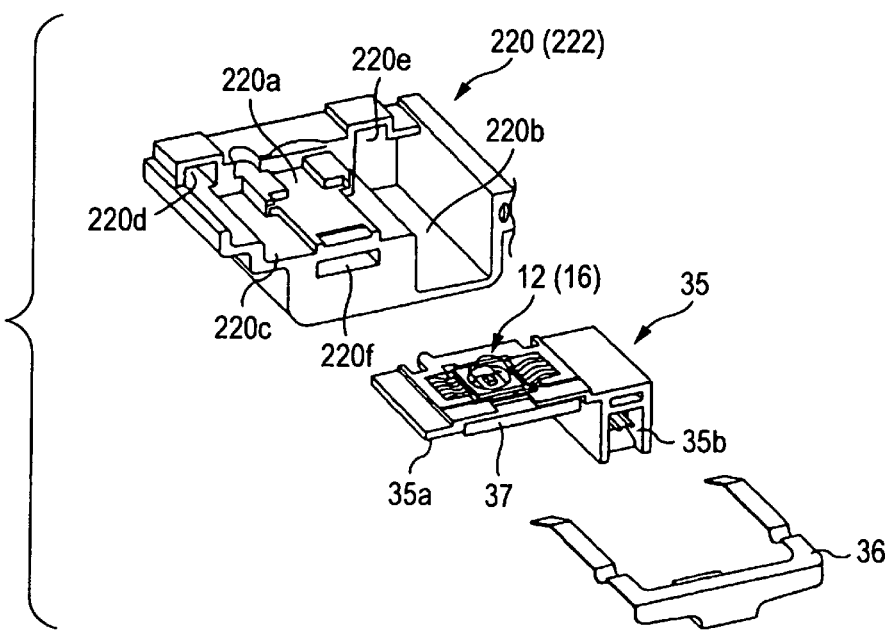
FIG. 12

PROJECTOR-TYPE LAMP UNIT FOR VEHICLE

The present invention claims foreign priority from Japanese patent application no. 2005-124108, filed on Apr. 21, 2005, the content of which is incorporated herein by reference.

BACKGROUND OF THE INVENTION

1. Field of the Invention

The present invention relates to a lamp unit used for a vehicle lamp and, in particular, relates to a projector-type lamp unit for a vehicle, which employs a semiconductor light emitting element as a light source.

2. Description of the Related Art

As a lamp for a vehicle such as a headlamp, for example, there are a projector-type and a paraboloidal reflector-type. The projector-type vehicle lamp is configured in a manner that a light emitted from a light source disposed on an optical axis is reflected toward the forward direction by a reflector and is converged close to the optical axis. The reflected light is irradiated in the forward direction of the lamp via a projection lens disposed on the forward side of the reflector. On the other hand, the paraboloidal reflector-type vehicle lamp is configured to include a light source disposed on an optical axis and a reflector, which is formed so as to have, as a reference surface, a rotating paraboloidal surface having a focal point near the light source. A light emitted from the light source is reflected toward the forward direction by the reflector as a parallel light so that the reflected light is irradiated in the forward direction of the lamp.

The projector-type vehicle lamp is smaller in the diameter of the reflector as compared with that of the paraboloidal reflector-type vehicle lamp. Therefore, the projector-type vehicle lamp can be miniaturized in its size. However, in the case where the discharge light emitting portion of a discharge bulb or the filament of a halogen lamp is used as the light source, in order to control the reflection of light from the light source suitably or to secure a space for attaching the light source, the reflector is required to have a certain size even for the projector-type vehicle lamp. Further, since a heat value of the light source is large, the size of the reflector is required to be set in view of the influence of the heat. Thus, it is difficult to further miniaturize the lamp.

In view of above, there is proposed a lamp which employs an LED (light emitting diode), for example, as a semiconductor light emitting element for a light source (for example, see Japanese Patent Unexamined Publication JP-A-2003-317513, pages 2 to 5 and FIG. 3).

When the light source is configured by an LED, since the light source can be treated as an almost point light source, the diameter of the reflector can be made small. Further, since it is not required for the reflector to secure a large attachment space nor to take the influence of the heat from the LED into consideration, the lamp can be made smaller as compared with the case where the discharge light emitting portion of the discharge bulb or the filament of the halogen lamp is used as the light source.

In the related art, since the reflector forming first and second reflecting surfaces and a light controlling member forming a third reflecting surface are formed by different members, the positional accuracy of the respective reflecting surfaces is not sufficient for an LED light source. Further, when the lamp is seen from the forward side thereof in the turning-off state, the outer appearance is not good since the members in an area outside of the reflecting surface area within the lamp can be seen.

SUMMARY OF THE INVENTION

According to a first aspect of the invention, a projector-type lamp unit for a vehicle includes a projection lens; a semiconductor light emitting element as a light source; a first reflecting surface, which reflects and condenses a light emitted from the light source toward the projection lens disposed in a forward direction from the light source; a second reflecting surface which reflects a part of the light reflected from the first reflecting surface toward the projection lens; and a design portion disposed between the second reflecting surface and the projection lens and connected to the second reflecting surface. The first reflecting surface, the second reflecting surface, and the design portion are formed as a one-piece structure.

BRIEF DESCRIPTION OF THE DRAWINGS

FIG. 11 is a sectional diagram of a main portion in which the LED is attached to the attachment;

FIG. 12 is an exploded perspective view for explaining a method of fixing the attachment attached with the LED to a fixing portion;

DESCRIPTION OF THE EXEMPLARY EMBODIMENT

Figure 1:
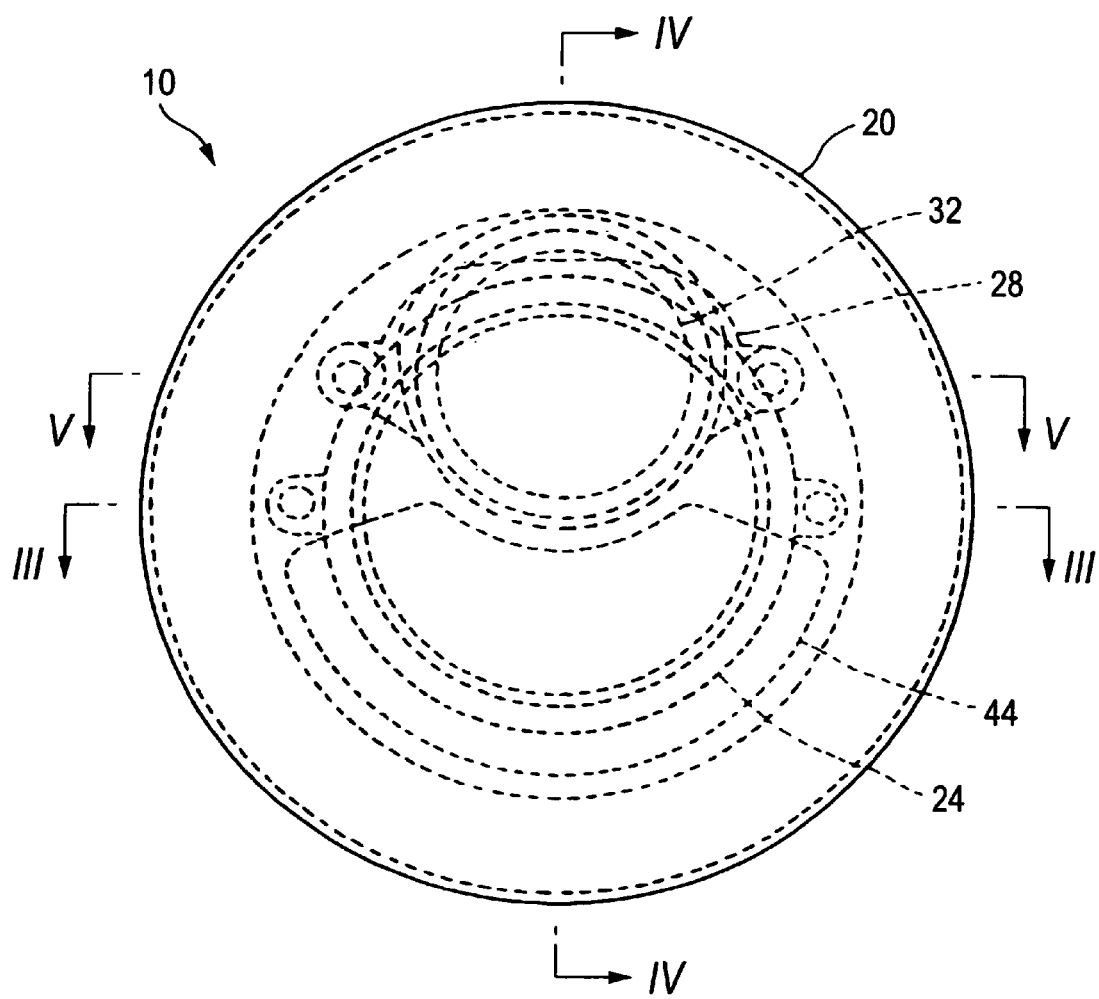
FIG. 1 is a front view showing a vehicle headlamp according to an exemplary embodiment of the invention.
Figure 2:
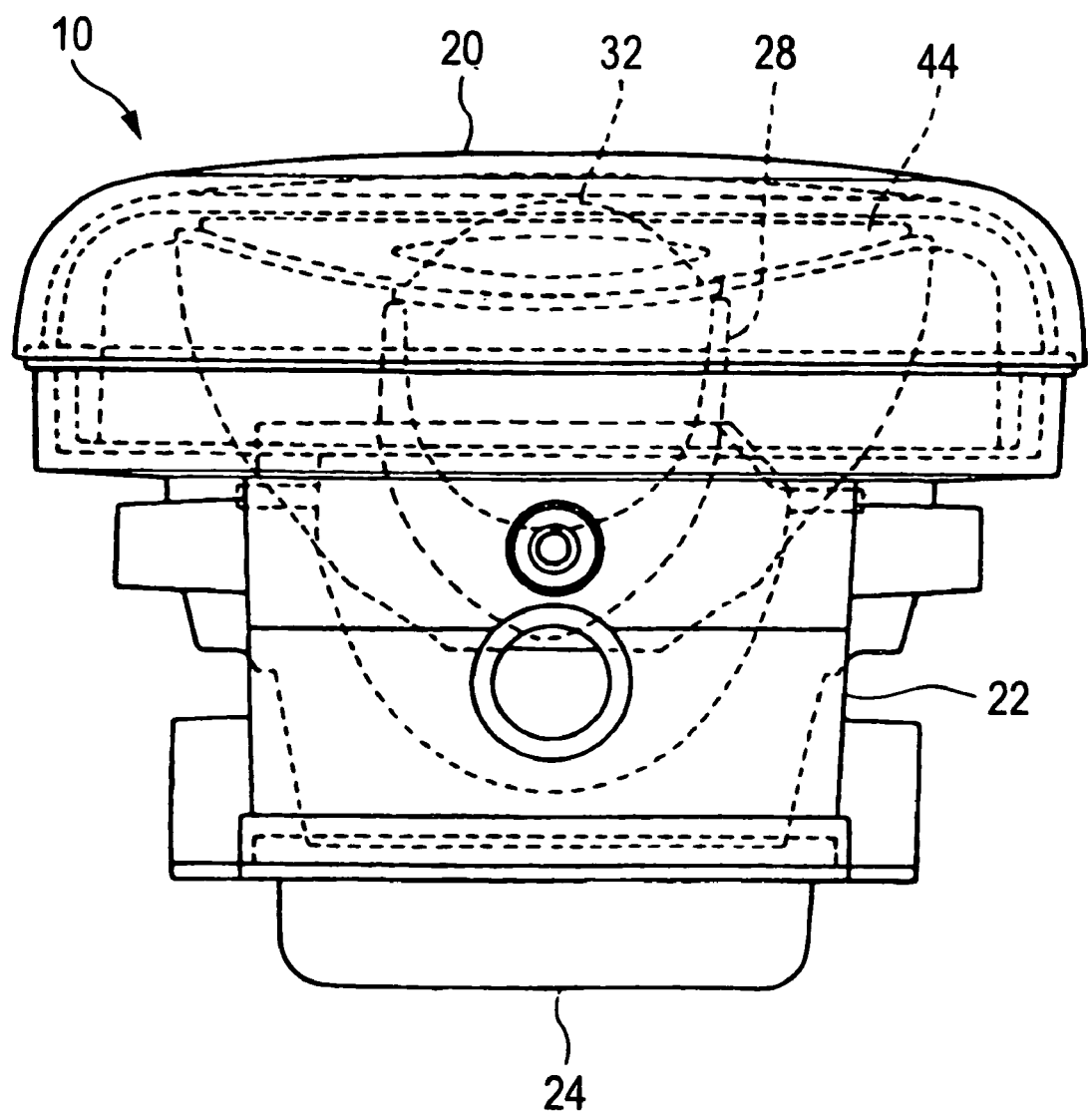
FIG. 2 is a bottom view showing the vehicle headlamp according to the embodiment of the invention.

Hereinafter, an exemplary embodiment of the invention will be explained with reference to the drawings. As shown in FIGS. 1 to 6, for example, the vehicle lamp 10 includes both a projector-type lamp unit 14 having an LED 12 (semiconductor light emitting element) as a first light source, a reflection-type (e.g., paraboloidal reflector-type) lamp unit 18 having an LED 16 as a second light source. The projector-type lamp unit 14 and the reflection-type lamp unit 18 are housed within a lamp chamber 26 having a front face cover 20 (outer lens), a lamp body 22, and a rear face cover 24. The reflection-type lamp unit 18 is disposed just beneath the projector-type lamp unit 14. The lower side of the projector-type lamp unit 18 almost contacts the reflection-type lamp unit 14. The vehicle lamp 10 is not limited to a vehicle lamp of a particular kind but may be used for a head lamp, an adverse weather lamp, a bending lamp, etc. A semiconductor laser may be used in place of the LED as the semiconductor light emitting element.

Figure 4:
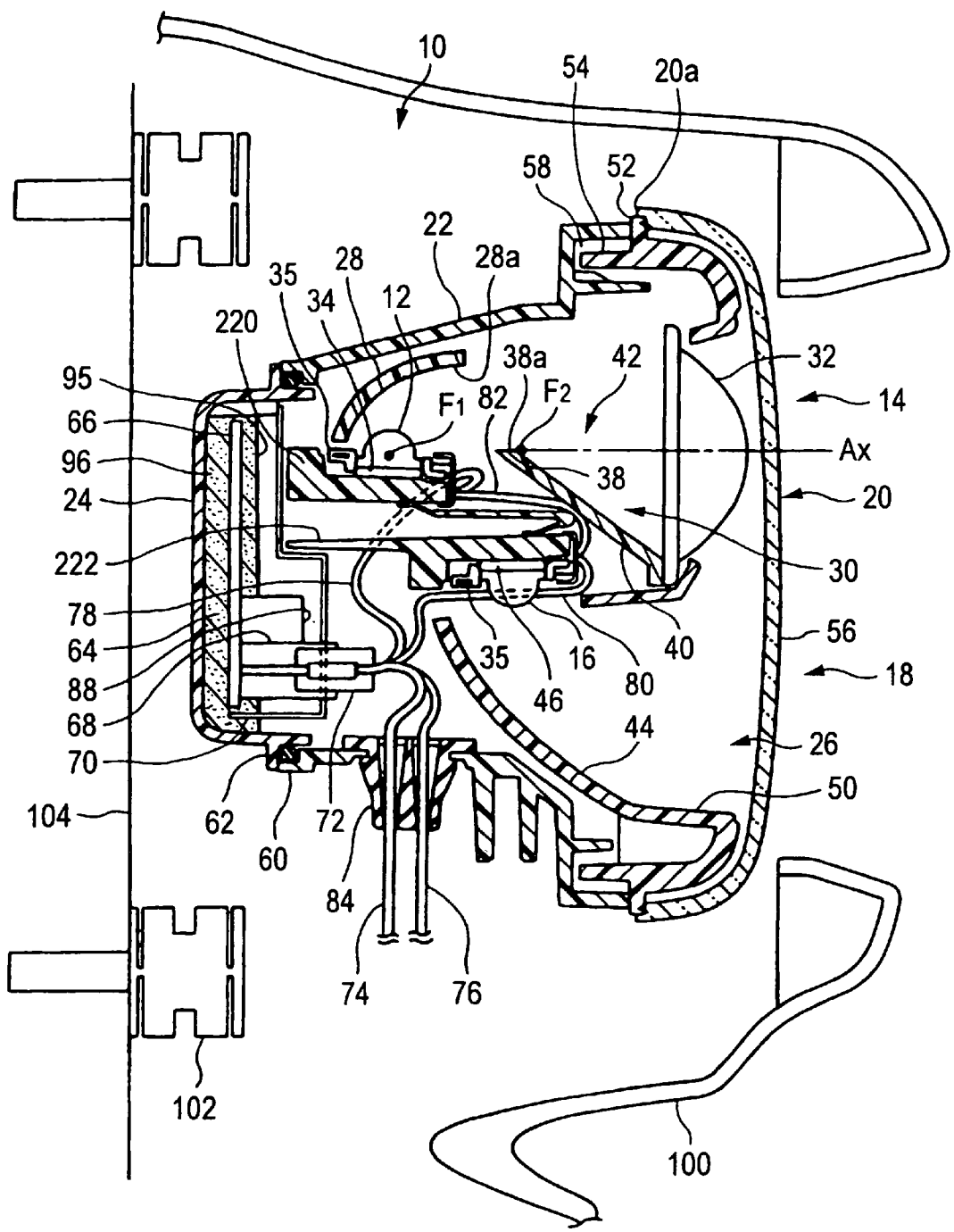
FIG. 4 is a sectional diagram cut along a line IV-IV in FIG. 1.
Figure 8:
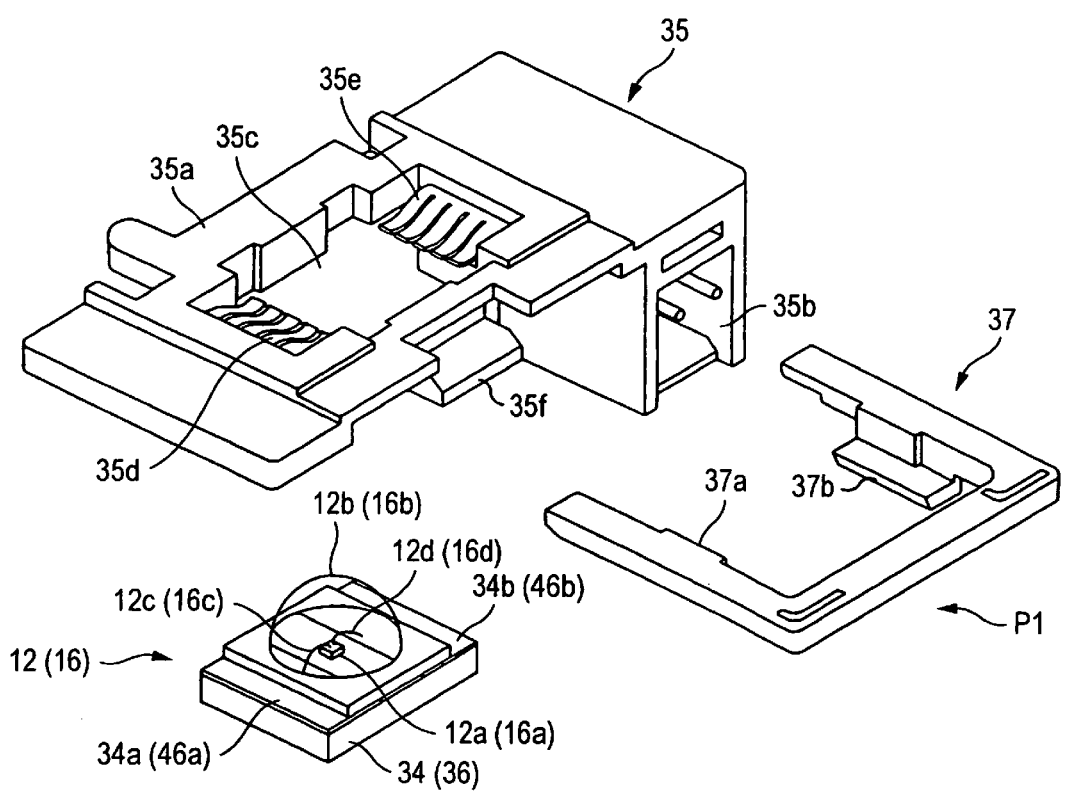
FIG. 8 is an exploded perspective view for explaining the relation between the LED and an attachment.

The projector-type lamp unit 14 includes the LED 12 as the first light source, a reflector 28, a coupling member 30 and a projection lens 32. As shown in FIG. 8, for example, the LED 12 (semiconductor light emitting element) is a white LED having an LED chip 12a with a square shape (each side being approximately 1 mm), a cap 12b of substantially hemisphere shape covering the LED chip 12a, and metal wires 12c, 12d. The LED 12 is disposed on a heat conductive and electrically insulating board 34 (ceramics, for example) 34 in a manner that the LED's irradiation face (irradiation direction) is provided in a direction almost perpendicular to the optical axis Ax of the projector-type lamp unit 14. That is, as shown in FIG. 4, the LED 12 is disposed substantially on the optical axis Ax. The LED chip 12a and conductive patterns 34a, 34b (e.g., metal thin films) are formed on the heat conductive and electrically insulating board 34 in a manner that the LED chip is sandwiched between the conductive patterns 34a, 34b. The conductive pattern 34a is coupled to the anode of the LED chip 12a via the metal wire 12c, and the conductive pattern 34b is coupled to the cathode of the LED chip 12a via the metal wire 12d. The heat conductive and electrically insulating board 34 is fixed to the fixing portion 220 of the lamp body 22. The board 34 is supported by an attachment 35 made of resin, a spring plate 36, etc. (see FIG. 13).

The fixing portion 220 is provided by extending the same material of the body 22 to formed an almost flat plate shape, by using a die cast of metal consisting mainly of aluminum. The fixing portion 220 is disposed at the upper portion on the inner peripheral side of the lamp body 22 (see FIGS. 12 and 13). That is, the fixing portion 220 made of metal is provided within the lamp body 22 and is linked with the lamp body 22. The fixing portion 220 is provided with a setting surface 220a for setting the heat conductive and electrically insulating board 34, portions 220b, 220c for attaching the attachment 35 thereon, and concave portions 220d, 220e, 220f for supporting the spring plate 36.

The attachment 35 includes a supporting portion 35a and a connector 35b serving as a feeding portion, as shown in FIG. 8. The supporting portion 35a is formed in an almost flat plate shape and provided with an opening 35c at almost the center portion thereof. Coupling terminals 35d, 35e are disposed at opposing sides of the opening 35c. Each of the coupling terminals 35d, 35e is formed in a curved shape by using a plate member made of metal. A part of each of the coupling terminals is buried within the attachment 35 and electrically coupled to the connector 35b. The attachment 35 is provided at its lower portion side with a projection 35f and concave portions 35g, 35h, which support an auxiliary attachment 37. The auxiliary attachment 37 is formed in an almost U-shape by using the resin material and is provided with projections 37a, 37b for supporting the heat conductive and electrically insulating board 34.

Figure 9:
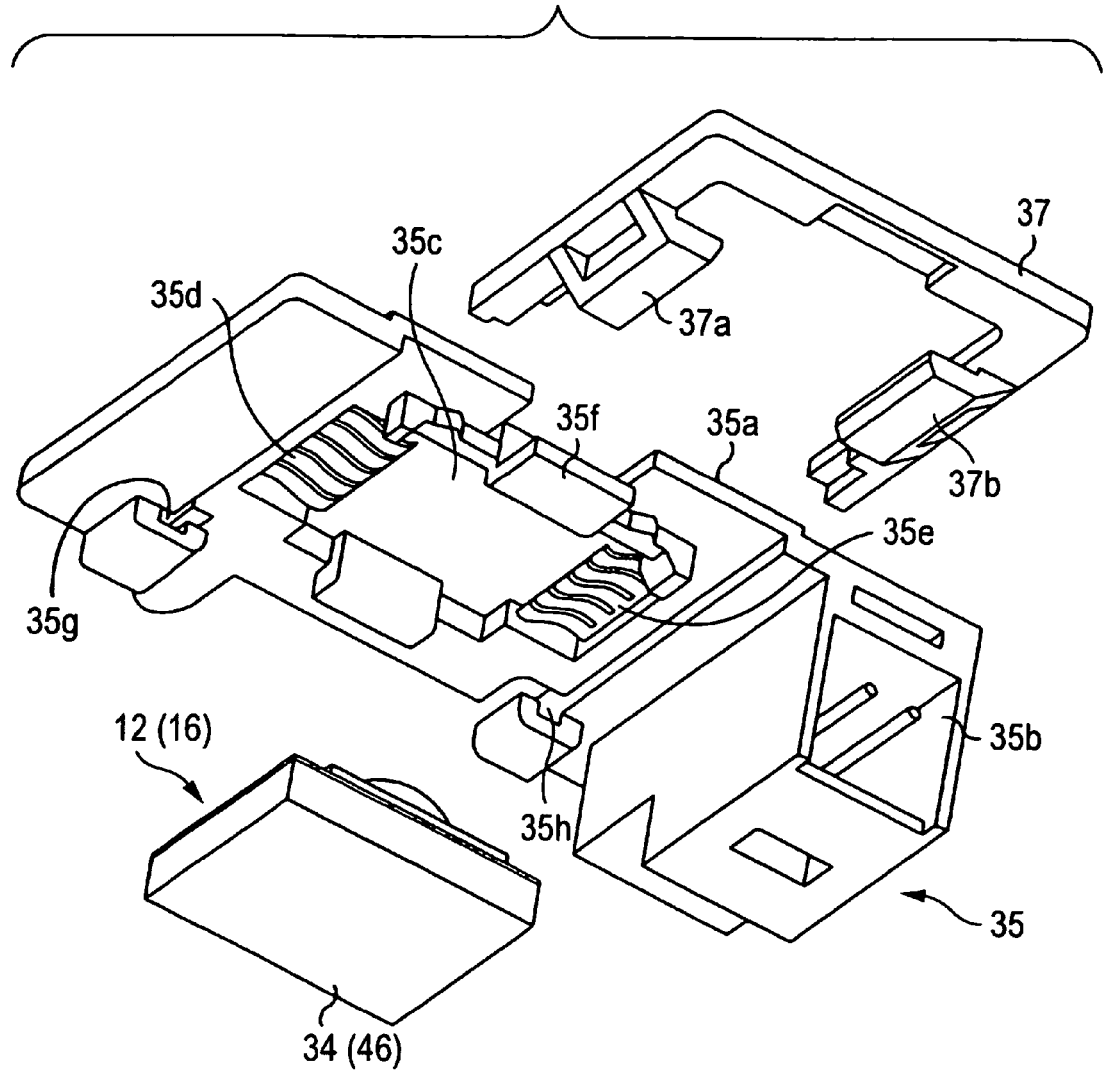
FIG. 9 is an exploded perspective view in which the LED is disposed at the lower portion side of the attachment.
Figure 10:
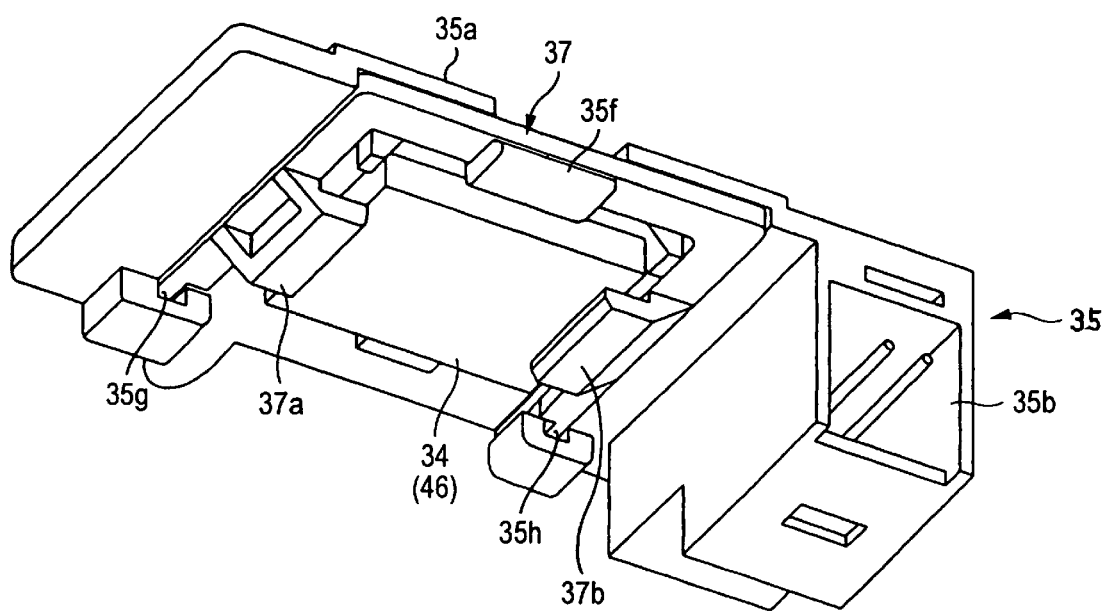
FIG. 10 is a perspective view in which the attachment attached with the LED is seen from the lower portion side thereof.

In the case of supporting the LED 12 by the attachment 35, as shown in FIG. 9, the heat conductive and electrically insulating board 34 is disposed on the lower portion side of the attachment 35. The heat conductive and electrically insulating board 34 is pushed up toward the opening 35c from the lower portion side of the attachment 35 so that the conductive patterns 34a, 34b on the heat conductive and electrically insulating board 34 contact with the coupling terminals 35d, 35e, respectively, and the LED 12 protrudes from the opening 35c. Thereafter, when the tip end side portions of the auxiliary attachment 37 are inserted into the portions 35g, 35h, respectively, the base end side of the auxiliary attachment 37 is supported by the projection 35f. Thus, as shown in FIGS. 10 and 11, the heat conductive and electrically insulating board 34 is pushed up toward the coupling terminals 35d, 35e in a state that the lower portion side of the insulation board 34 is supported by the projections 37a, 37b of the auxiliary attachment 37. Therefore, the conductive patterns 34a, 34b on the heat conductive and electrically insulating board 34 contact the coupling terminals 35d, 35e, respectively, with a pressure. The coupling terminal 35d is coupled to the anode of the LED chip 12a via the conductive pattern 34a and the metal wire 12c, whilst the coupling terminal 35e is coupled to the cathode of the LED chip 12a via the conductive pattern 34b and the metal wire 12d.

Figure 13:
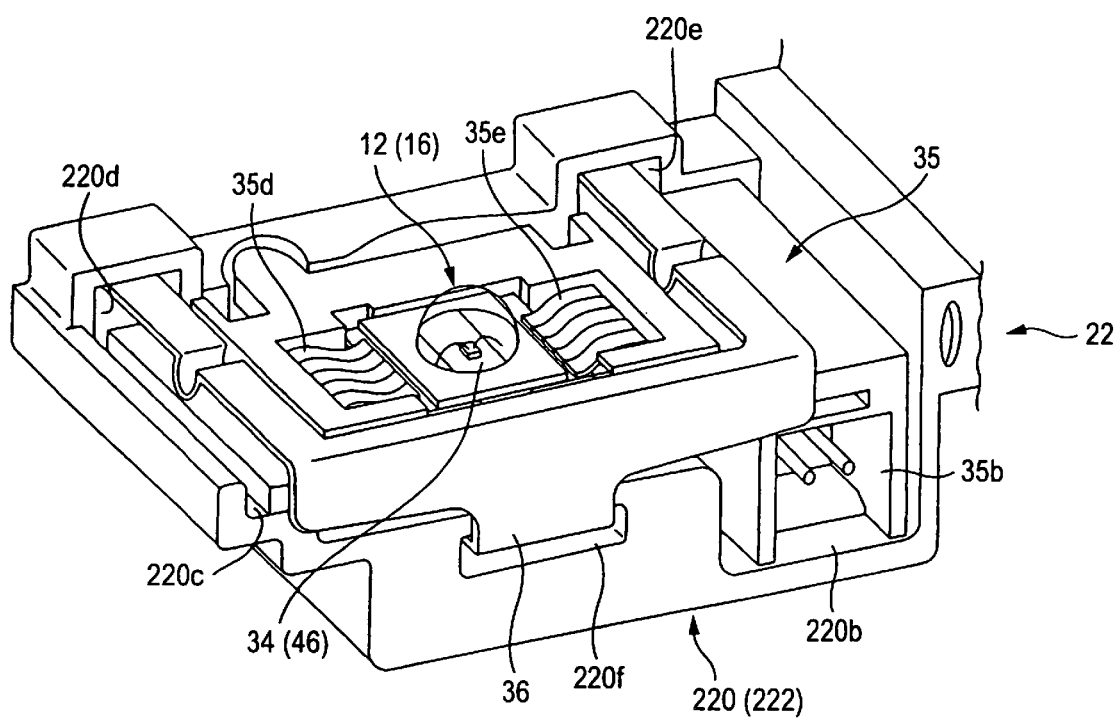
FIG. 13 is a perspective view showing a state where the attachment attached with the LED is fixed to the fixing portion.

In the case of fixing the attachment 35 attached with the LED 12 to the fixing portion 220 of the lamp body 22, as shown in FIGS. 12 and 13, the connector 35b of the attachment 35 is attached within the concave portion 220b and the left side of the supporting portion 35a is attached within the concave portion 220c, whereby the heat conductive and electrically insulating board 34 contacts the setting surface 220a. Next, the tip end side portions of the spring plate 36 are inserted into the concave portions 220d, 220e of the fixing portion 220 and the base end side of the spring plate 36 is inserted into the concave portion 220f of the fixing portion 220, whereby the elastic force of the spring plate 36 acts on the attachment 35 to the vertically downward direction. Thus, the entire attachment 35 is attached with a pressure to the fixing portion 220, and the heat conductive and electrically insulating board 34 is attached with a pressure to the setting surface 220a. That is, the LED 12 contacts, at a rear surface side of the light emitting surface thereof, the setting surface 220a via the heat conductive and electrically insulating board 34 and is fixed thereto. Since the setting surface 220a is integrally formed with the fixing portion 220 of the lamp body 22 made of aluminum, heat generated from the LED 12 can be efficiently radiated via the heat conductive and electrically insulating board 34, the setting surface 220a, the fixing portion 220, and the lamp body 22.

The first reflector 28 (polycarbonate, for example) is formed almost in a dome shape and is disposed above the LED 12. The reflector 28 is subjected at its surface to vapor deposition using aluminum. Therefore, the first reflector 28 has a first reflecting surface 28a, which reflects light emitted from the LED 12 in the forward direction so as to be condensed near the optical axis Ax. The first reflecting surface 28a is formed in an almost ellipsoidal shape having the optical axis Ax as the center axis thereof and serves as a reflecting surface, which reflects and condenses the light emitted from the LED 12 toward the projection lens 32 disposed at the front direction with respect to the LED 12. The first reflecting surface 28a is set in a manner that its sectional shape including the optical axis Ax is set to an almost elliptical shape and the eccentricity of the elliptical shape becomes larger gradually from the vertical section thereof toward the horizontal section thereof. The LED 12 is disposed at a first focal point F1 of the ellipse forming the vertical section of the first reflecting surface 28a (see FIG. 6). Thus, the first reflecting surface 28a can reflect light emitted from the LED 12 in the forward direction so as to be condensed near the optical axis Ax. In this case, the first reflecting surface 28a is set to converge the reflected light almost on the second focal point F2 of the ellipse in the vertical section including the optical axis Ax.

Figure 14:
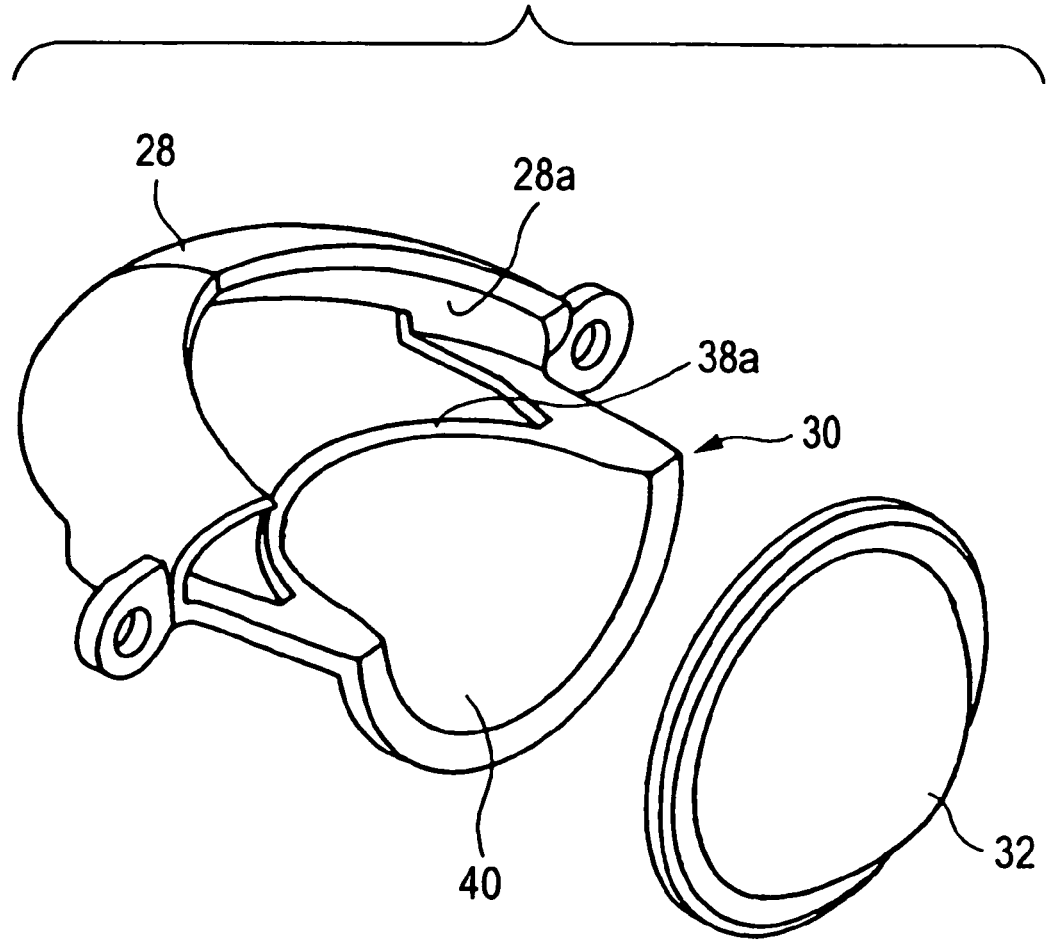
FIG. 14 is an exploded perspective view for explaining the relation between a reflection mirror unit and a projection lens.

The coupling member 30 includes a flat portion 38 disposed at the almost lower side of the optical axis Ax and a semi-tubular design portion 40 of an almost bucket shape (see FIG. 14). The coupling member 30 is formed by polycarbonate so as to be integrally molded with the reflector 28 and is disposed between the LED 12 and the projection lens 32. The flat portion 38 is integrally coupled to the reflector 28 and fixed to the lamp body 22 by screws. The end portion on the front side of the design portion 40 is melted and adhered by using ultrasonic bonding to the projection lens 32 having the contour of an almost hemispherical shape. Each of the flat portion 38 and the design portion 40 is subjected at its surface to vapor deposition using aluminum. As shown in FIG. 14, the flat portion 38 is provided with a second reflecting surface 38a, which reflects a part of the reflected light from the first reflecting surface 28a of the reflector 28 to the forward direction, that is, toward the projection lens 32.

Figure 15:
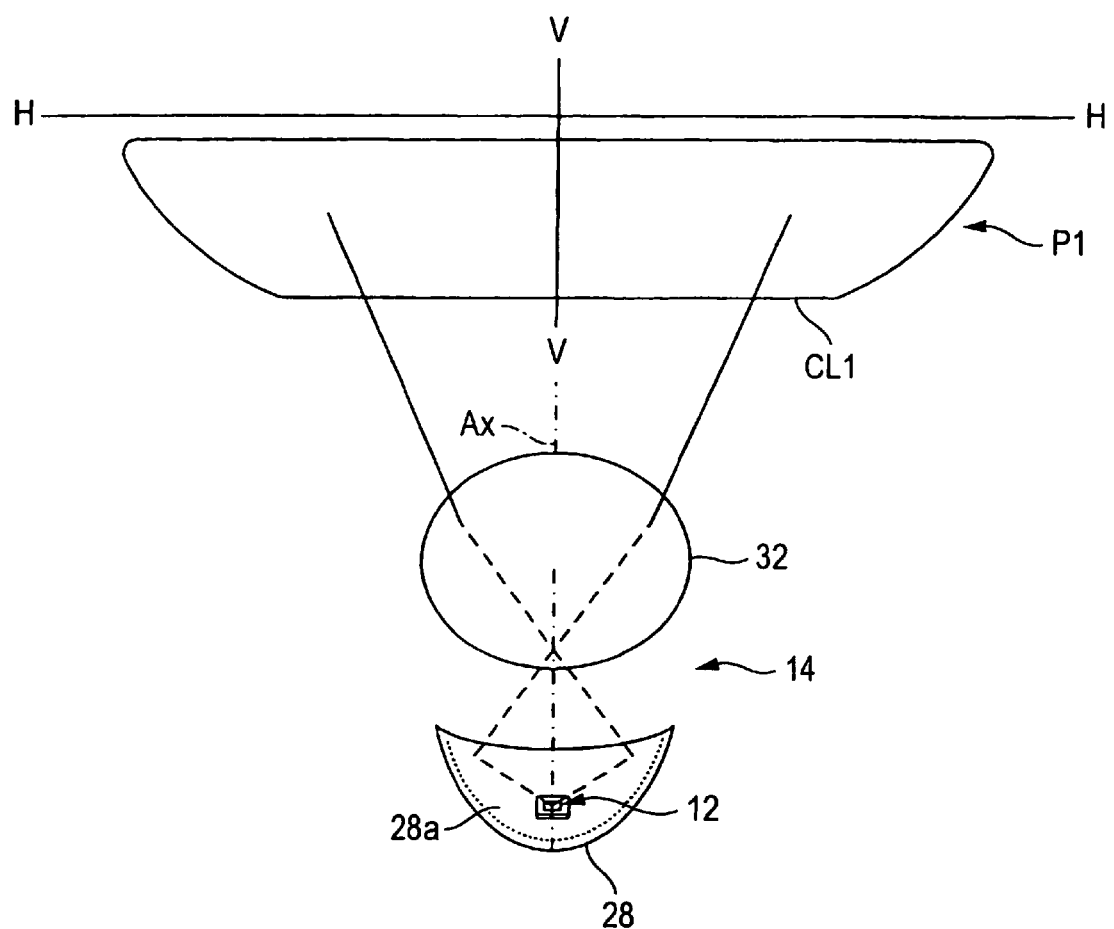
FIG. 15 is a schematic diagram of the projector-type lamp unit and a cut-off line forming light distribution pattern, each seen through from the rear surface side, which is formed on a phantom vertical screen disposed at a portion 10$m$ ahead of the lamp by a beam irradiated from the projector-type lamp unit.

The design portion 40 is disposed along the inclined downward direction from the boundary between the design portion and the flat portion 38 so as to couple between the edge of the flat portion 38 and the lower portion side of the projection lens 32. The design portion 40 is configured to cover a reflected light path which conducts the reflected light from the first reflecting surface 28a of the reflector 28 to the projection lens 32. That is, the design portion 40, which is connected to the second reflecting surface 38a, is disposed between the second reflecting surface 38a and the projection lens 32. The design portion is formed in a semi-tubular almost bucket shape adjacent to and along the reflected light path directed from the first reflecting surface 28a to the outer peripheral line of the projection lens 32, of almost hemispherical shape so as to cover the reflected light from the first reflecting surface 28a without shielding. Thus, the reflected light from the first reflecting surface 28a can be effectively entered into the projection lens 32. Further, since the rear side space of the reflected light path can be used effectively, the head lamp can be miniaturized. Further, the portion near the boundary portion between the flat portion 38 and the design portion 40 is set to the second focal point F2. Furthermore, the boundary portion between the second reflecting surface 38a of the flat portion 38 and the design portion 40 is formed so as to have a predetermined cut-off line in the light distribution pattern of the vehicle lamp 10. That is, the boundary portion between the second reflecting surface 38a of the flat portion 38 and the design portion 40 serves as a shade for shielding a part of the reflected light from the first reflecting surface 28a, whereby the beam irradiated from the projector-type lamp unit 14 can form a light distribution pattern P1 having a cut-off line CL1 like the light distribution pattern of an adverse weather lamp etc. as shown in FIG. 15, for example.

In this case, a light shielding end face of the shade is extended toward the rear direction along the optical axis Ax thereby to form the second reflecting surface 38a which reflects the reflected light from the first reflecting surface 28a toward a predetermined direction so that the light to be shielded originally by the shade can be effectively used as an irradiation light beam. Thus, the light beam to be used for the projector-type lamp unit 14 can be further increased. Further, the boundary portion between the second reflecting surface 38a and the design portion 40 are formed to have the configurations so as to form the cut-off line CL1 in the light distribution pattern of the lamp and also serve as the shade, it is not necessary to provide the shade as an independently provided part.

The projection lens 32 is formed substantially in a hemisphere shape (i.e., dome shape) by using translucent resin such as polycarbonate. The projection lens 32 is disposed on the rear surface side of the front face cover 20, whereby the light reflected from the first reflecting surface 28a and transmitted to the design portion 40 passes in the forward direction through the projection lens 32 (see FIG. 14). In this case, much of the light reflected from the first reflecting surface 28a passes through the lower half area of the projection lens 32 and is irradiated on the front face cover 20. On the other hand, a part of the light reflected from the first reflecting surface 28a is reflected by the second reflecting surface 38a and passes through almost the upper half area of the projection lens 32 and is irradiated on the front face cover 20.

According to the projector-type lamp unit 14 of the embodiment, the reflector 28, and the coupling member 30 are formed as a one-piece structure. That is, a reflection mirror unit 42 of the projector-type lamp unit 14 is a one-piece structure including the first reflecting surface 28a, the second reflecting surface 38a, and the design portion 40. By this structure, the positional accuracy of the first reflecting surface 28a and the second reflecting surface 38a can be enhanced. Further, the light distribution efficiency can be improved and the number of parts can be reduced. Furthermore, since the projection lens 32 is fixed to the reflection mirror unit 42, the positional accuracy of the reflection mirror unit 42 and the projection lens 32 can be enhanced and the light distribution efficiency can be further improved.

The projector-type lamp unit 14 also may be configured without a projection lens 32. In this case, at the time of assembling the vehicle lamp 10, the projection lens 32 may be disposed at a predetermined position on the forward side of the projector-type lamp unit 14 along the optical axis Ax.

On the other hand, as shown in FIGS. 3 to 6, the reflection-type lamp unit 18 is configured by the LED 16 and a reflector 44. As shown in FIG. 8, the LED 16 (semiconductor light emitting element) is configured by, as the second light source, a white LED having an LED chip 16a with a square shape (each side being almost 1 mm), a cap 16b of an almost hemisphere shape covering the LED chip 16a and metal wires 16c, 16d. The LED is disposed on a heat conductive and electrically insulating board (ceramics, for example) 46 in a manner that its irradiation face (irradiation direction) is provided in an almost vertically downward direction (direction in opposite to the irradiation direction of the LED 12). The LED 16 is disposed in the forward direction with respect to the LED 12 and in parallel with the optical axis Ax (that is, in the forward side of the lamp). The LED 16 is disposed at a position in a vacant area which is not used for the transmission of the reflected light from the first reflecting surface 28a and is away from the reflected light path conducting the reflected light from the first reflecting surface 28a of the projector-type lamp unit 14 to the projection lens 32. The LED chip 16a and conductive patterns 46a, 46b (metal thin films) are formed on the heat conductive and electrically insulating board 46 in a manner that the LED chip is sandwiched between the conductive patterns. The conductive pattern 46a is coupled to the anode of the LED chip 16a via the metal wire 16c, and the conductive pattern 46b is coupled to the cathode of the LED chip 16a via the metal wire 16d. The heat conductive and electrically insulating board 46 is fixed to a fixing portion 220 of the lamp body 22 in a state of being supported by the attachment 35 made of resin, the spring plate 36, etc. (see FIG. 13).

The fixing portion 222 is formed by extending the same material of the lamp body 22 to formed an almost flat plate shape, by using a die cast of metal consisting mainly of aluminum. The fixing portion 222 is disposed at the lower portion on the inner peripheral side of the lamp body 22 so as to oppose to the fixing portion 220. The fixing portion 222 has a configuration that is the reverse of the fixing portion 220 in both the vertical and horizontal directions. Further, the fixing portion 222 is configured in a manner that a concave portion etc. for supporting the attachment 35 and the spring plate 36 etc. are formed in the forward side of the lamp with respect to the fixing portion 220 (see FIG. 6), but the remaining configuration thereof is same as that of the fixing portion 220 and so the detailed explanation thereof is omitted.

When the attachment 35 is fixed to the fixing portion 222 of the lamp body 22 together with the LED 16, the LED 16 attached to the attachment 35 contacts, at the rear surface side of the light emission surface thereof, with the fixing portion 222 and is fixed thereto via the heat conductive and electrically insulating board 46. Thus, heat generated from the LED 16 can be efficiently radiated via the heat conductive and electrically insulating board 46, the fixing portion 222, and the lamp body 22. In this case, since the LED 12 and the LED 16 are separately fixed to the fixing portion 220 and the fixing portion 222, respectively, so as to be disposed at different positions on the horizontal plane, each one of the respective LEDs is less influenced by the heat generated from the other of the LEDs. Accordingly, the heat can be radiated effectively.

Figure 6:
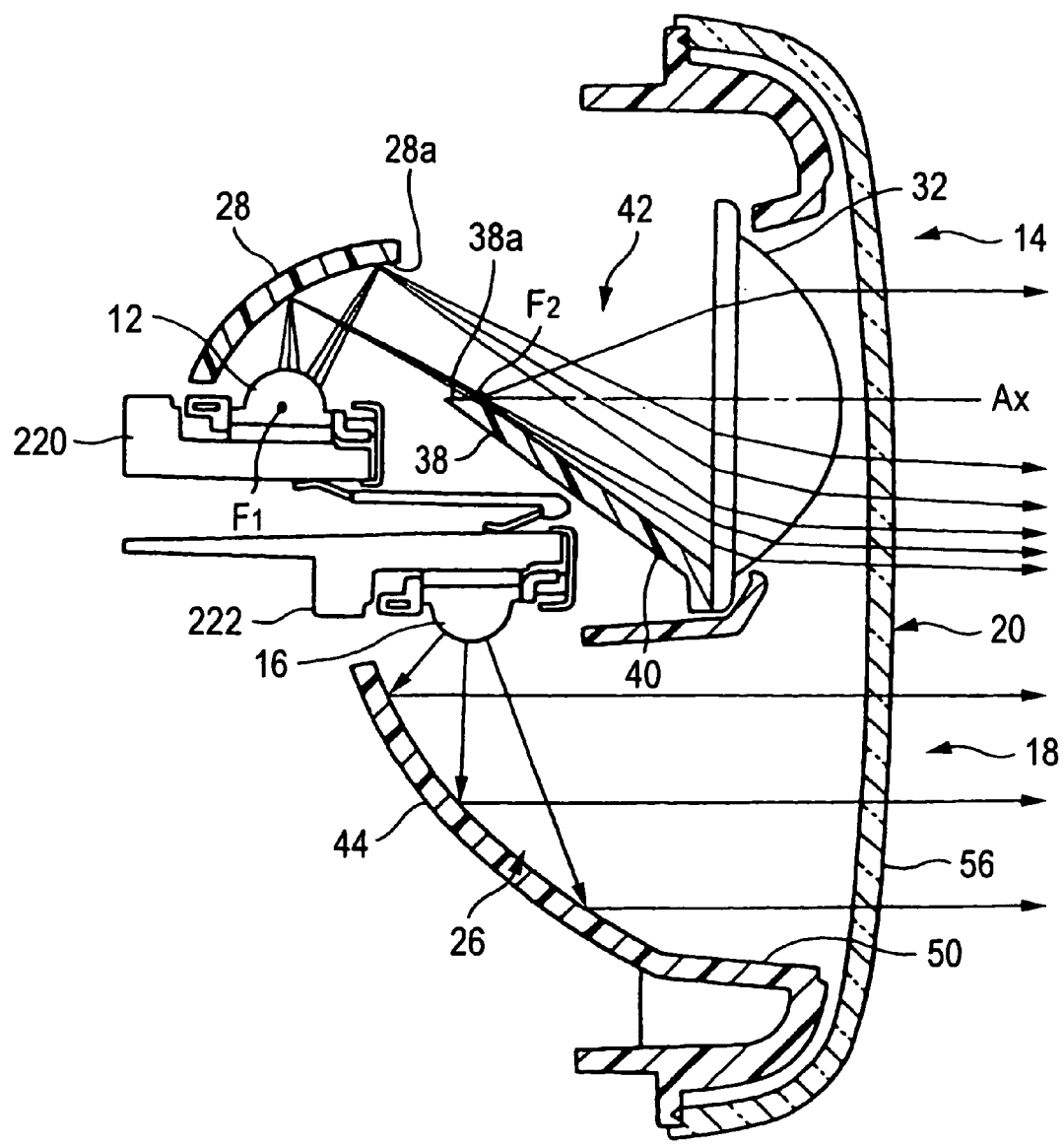
FIG. 6 is a sectional diagram of a main portion for explaining a reflection path of a light emitted from an LED.

The reflector 44 (second reflector) is formed in an almost paraboloidal shape. The reflector 44 is formed using, for example, polycarbonate. This reflector 44 is positioned on the forward side of the lamp, with respect to the rear end surface of the reflector 28 (first reflector) and disposed below the LED 16. The reflector 44 is formed as a reflecting surface which includes, as a reference surface, paraboloidal surface, which is formed by a parabola having a focal point near the LED 16b. The surface of this reflector is deposited with aluminum. Thus, as shown in FIG. 6, the reflector reflects the light emitted from the LED 16 and irradiates the reflected light as almost parallel ray in the forward direction (irradiates as a diffused light in the horizontal direction). Further, the reflector 44 is formed as a one-piece structure with an extension 50, for shielding the peripheries of the projector-type lamp unit 14 and the reflection-type lamp unit 18 so as not to be seen from the forward direction of the lamp. The reflector 22 is disposed on the rear surface side of the extension 50. The extension 50 is formed in an almost cylindrical shape and the surface (the front face side) thereof is deposited with aluminum. Since the reflector 44 and the extension 50 are a one-piece structure, a step portion can be eliminated therebetween, and the appearance thereof at the time of the turning-off of the lamp can be attractive and further the number of parts can be reduced. Further, since the reflector 44 and the extension 50 are a one-piece structure, the front face side of the extension 50 and the reflecting surface of the reflector 44 can be simultaneously deposited with aluminum, whereby the deposition process can be simplified. That is, since the mirror finishing process such as the deposition process may be performed once with respect to the single member (the formed extension 50 and reflector 44), the simplification of the processing procedure and the cost reduction can be further realized as compared with the related art in which the mirror finishing process is performed with respect to the two members separately.

The reflection-type lamp unit 18 according to the embodiment is disposed so as to almost contact the lower side of the projector-type lamp unit 14. Therefore, the reflection-type lamp unit effectively utilizes a vacant area of the projector-type lamp unit 14, which is not used for the transmission of the reflected light from the first reflecting surface 28a. The effective use of this space can contribute to the miniaturization of the lamp. Further, since the projector-type lamp unit 14 and the reflection-type lamp unit 18 are fixed to the flat-plate shaped fixing portions 220, 222, which are formed by extending a part of the lamp body 22, the relative positional accuracy can be improved and the light distribution accuracy of the lamp can also be improved.

Figure 16:
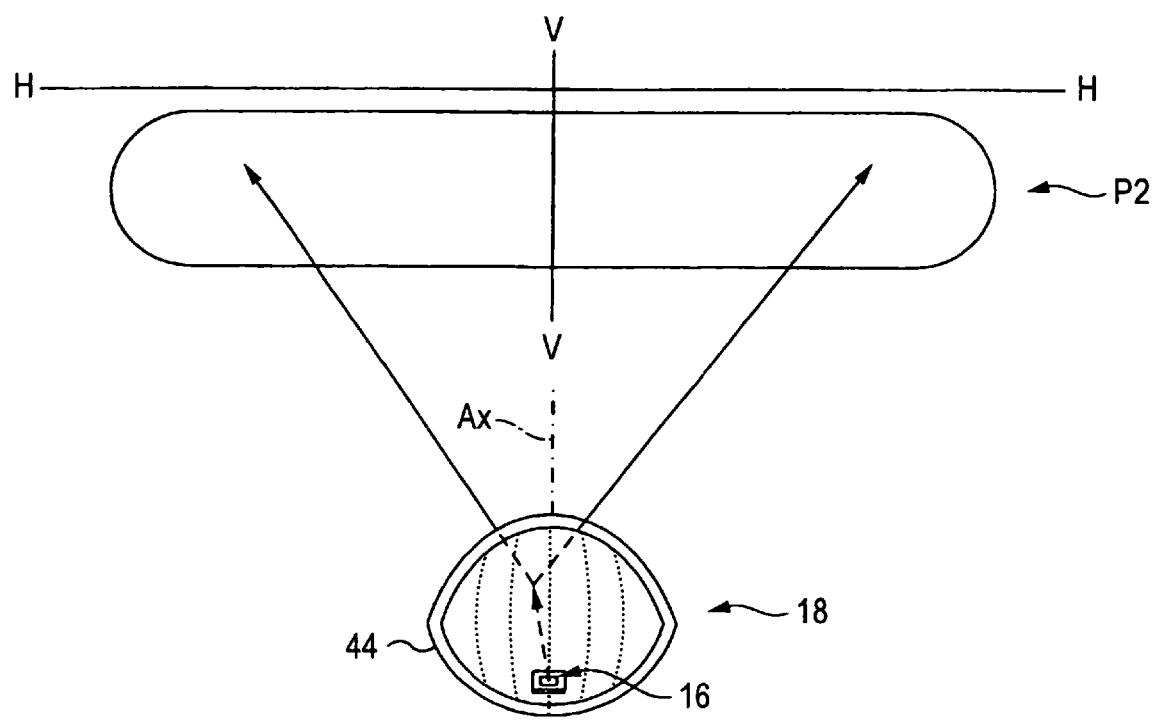
FIG. 16 is a schematic diagram of the reflection-type lamp unit and a light distribution pattern, each seen through from the rear surface side, which is formed on a phantom vertical screen disposed at a portion 10$m$ ahead of the lamp by a beam irradiated from the reflection-type lamp unit.

In the reflection-type lamp unit 18 according to the embodiment, a light distribution pattern P2 shown in FIG. 16, for example, can be formed by the light beam irradiated from the reflection-type lamp unit 18. The front face cover 20 is disposed in the forward direction of the extension 50 and the lamp body 22 is disposed on the rear surface side thereof. An annular flange portion 52 is formed on the side surface of the extension 50 and an annular projection 54 is formed on the rear surface of the extension. The front face cover 20 is melted and adhered by ultrasonic bonding to the flange portion 52, and the lamp body 22 is attached to the projection 54.

The front face cover 20 (for example, polycarbonate) is formed in an almost cylindrical shape. The front face cover 20 is attached to the lamp body 22 so as to cover the front face of the lamp body 22, and the one end side of the front face cover 20 is closed by an irradiation portion 56 of an almost disc shape which allows the light from the respective lamp units 14, 18 to penetrate therethrough and thereby irradiate in the forward direction of the lamp. When the light from the respective lamp units 14, 18 is irradiated in the forward direction of the lamp from the front face cover 20, a predetermined light distribution pattern is formed. An annular adhesion surface 20a is formed on the opening side end surface of the front face cover 20. The adhesion surface 20a is melted and adhered by using ultrasonic bonding to the flange portion 52 of the extension 50.

Figure 3:
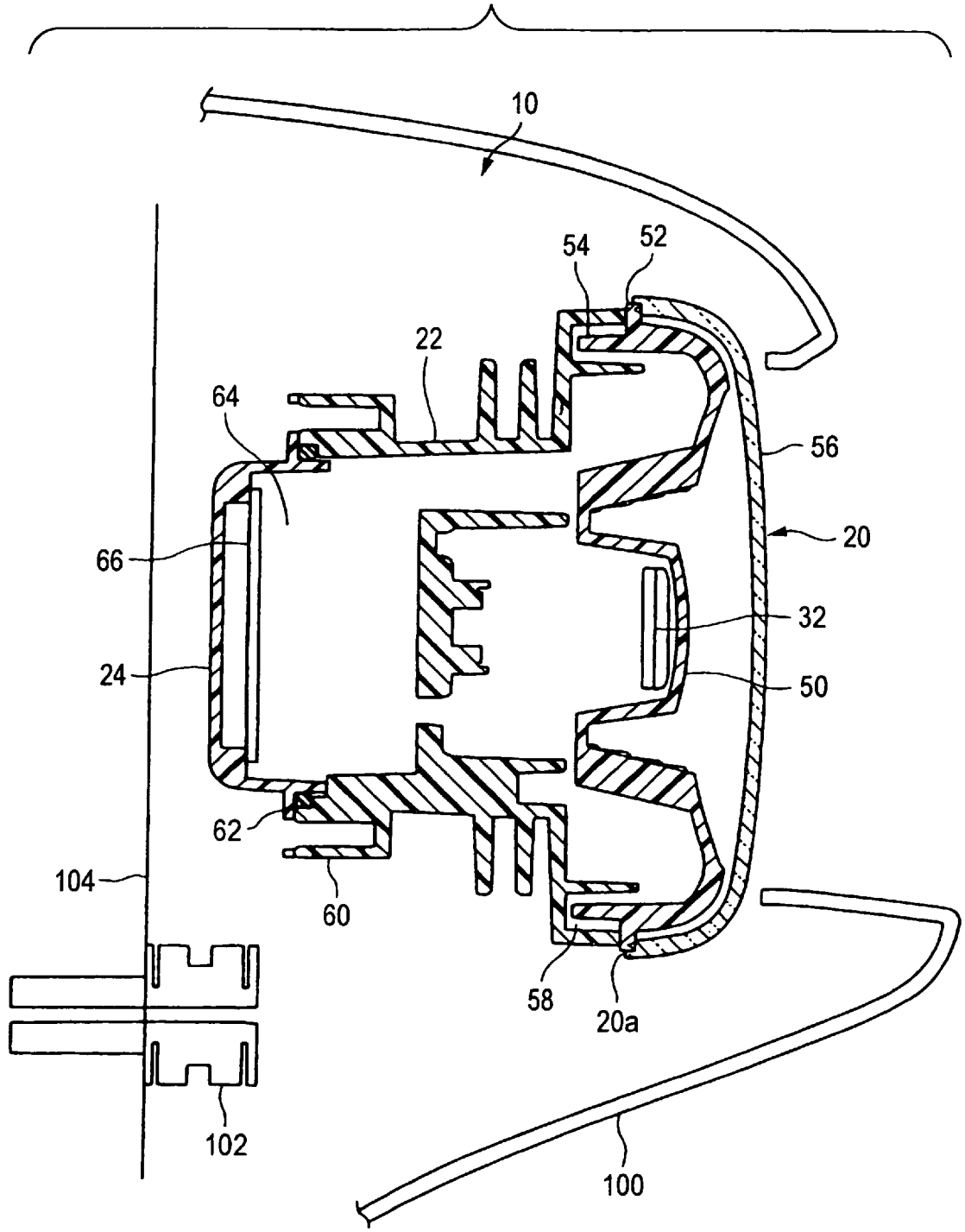
FIG. 3 is a sectional diagram cut along a line III-III in FIG. 1.
Figure 5:
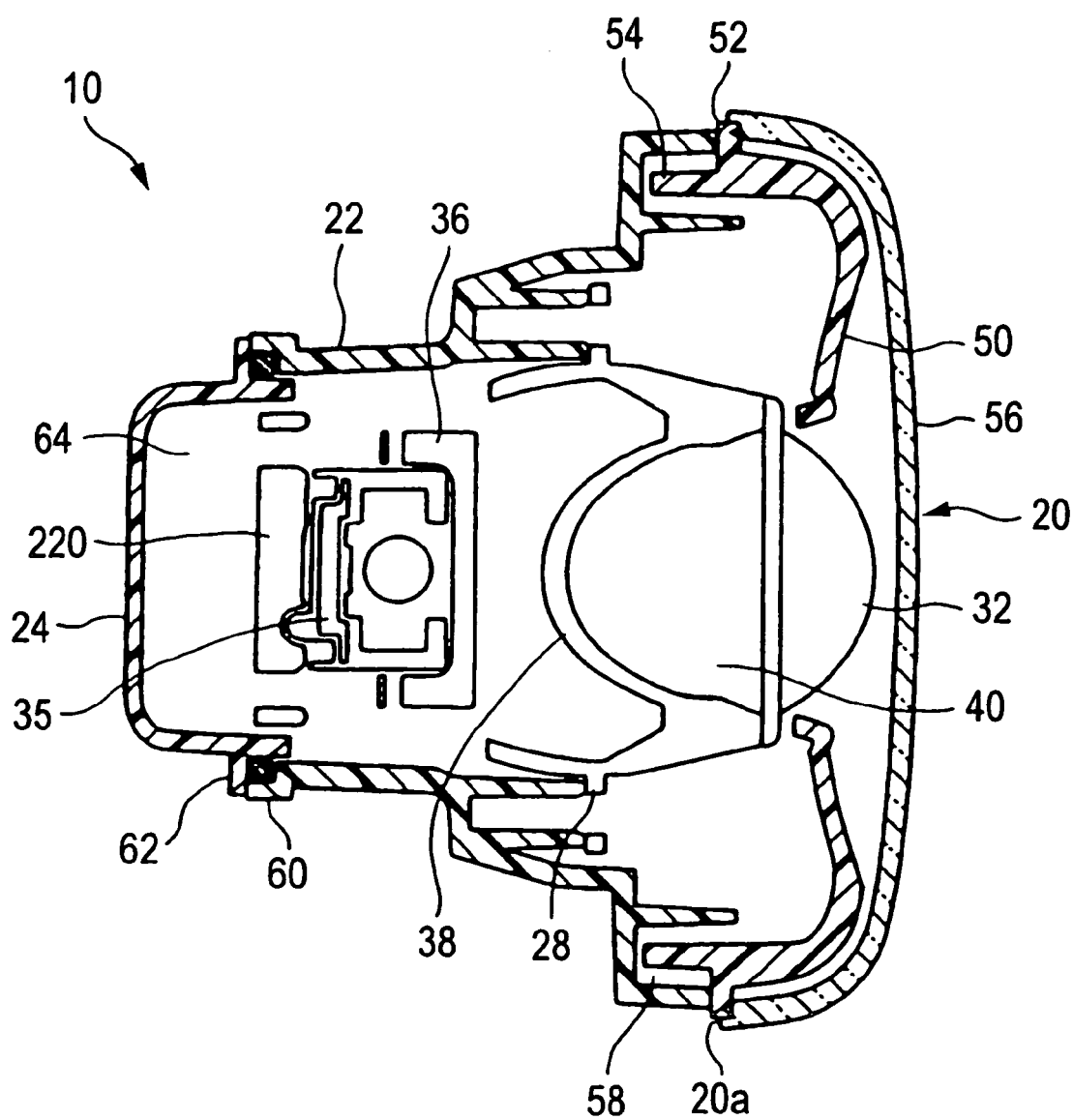
FIG. 5 is a sectional diagram cut along a line V-V in FIG. 1.

As shown in FIGS. 3 to 5, the lamp body 22 is configured as a cylindrical body, with front and rear surfaces opened. The lamp body is formed by using a die cast of metal consisting mainly of aluminum. An annular seal groove 58 is formed at the opening end portion on the front face side of the lamp body 22, and an attachment portion 60 is formed on the rear surface side thereof. The lamp body 22 is arranged in a manner that, at the time of the assembling thereof, the projection 54 of the extension 50 is attached within the seal groove 58, and then the extension 50 and the lamp body 22 are mutually adhered by the sealing material filled in the seal groove 58 thereby to seal the space therebetween. Further, the lamp body 22 is arranged in a manner that the attachment portion 60 is coupled to the attachment portion 62 of the rear face cover 24 via screws.

Since the lamp body 22 in this embodiment is configured by metal, the heat resistance and the heat radiation property of the lamp body can be enhanced as compared with the lamp body 22 configured by resin, whereby the miniaturization of the lamp can be realized in the embodiment.

As shown in FIGS. 3 to 5, the rear face cover 24 is configured as a cylindrical body, in which the front surface is open and the rear surface is closed. The rear face cover is formed by using a die cast of metal consisting mainly of aluminum. The rear face cover 24 is attached to the lamp body 22 so as to cover the rear surface thereof. A concave portion 64 having a concave space is formed within the rear face cover 24. A circuit board 66 for driving the light sources (LEDs 12, 16) is attached to the concave portion 64 in an almost vertical state. As shown in FIG. 4, a driving circuit for driving the LEDs 12, 16 and a socket 68 (for feeding the LEDs 12, 16 and the driving circuit, etc.) are mounted on the circuit board 66. The periphery of the circuit board 66 is covered by an electromagnetic shielding cover 70. A connector 72 is detachably attached to the socket 68 in which four pins are disposed in the horizontal direction. Four lead wires 74, 76, 78, 80 are coupled to the connector 72. The lead wires 74, 76 are passed within a bushing 84 disposed beneath the lamp body 22 and coupled to a battery (not shown), whereby the driving circuit is supplied with electric power from the battery via the lead wires 74, 76 and the connector 72. The lead wire 78 is coupled to the one terminal of the connector 35b of the attachment 35 attached to the fixing portion 220. A lead wire 82 coupled to the other terminal of the connector 35b is coupled to the one terminal of the connector 35b of the attachment 35 attached to the fixing portion 222. The lead wire 80 is coupled to the other terminal of the connector 35b.

That is, the LEDs 12, 16 are coupled in series with and supplied with electric power from the driving circuit via the lead wire 78, the lead wire 82 and the lead wire 80. In the case of supplying electric power to the driving circuit from the battery, since the bushing 84 is disposed beneath the lamp body 22 (beneath the lamp), it is possible to prevent such a phenomenon from occurring that water etc. enters into the lamp via the lead wires 74, 76 etc. which are passed through the busing 84 in order to supply electric power to the circuit board 66. Further, insulation resin 96 is filled in an area equal to or lower than a resin filling line 95 within the rear face cover 24 containing the circuit board 66, whereby various kinds of parts (i.e., circuit parts) etc. constituting the driving circuit are fixed by the resin 96.

Figure 7A:
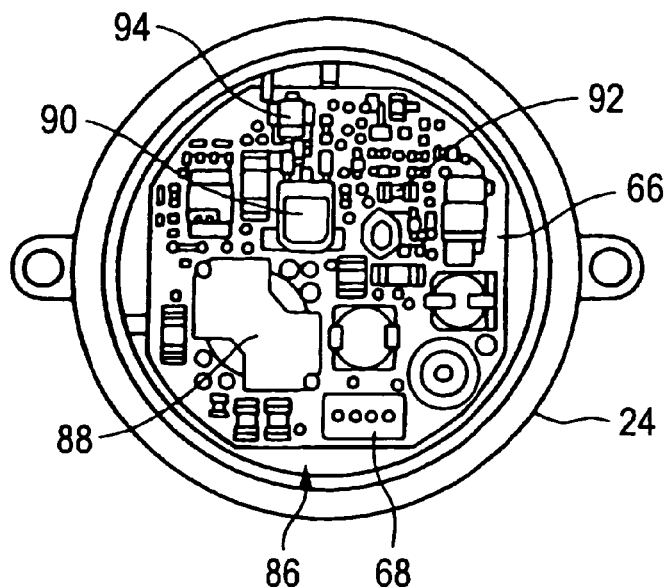
FIG. 7A is a front view of a rear surface cover to which a circuit board is attached.
Figure 7B:
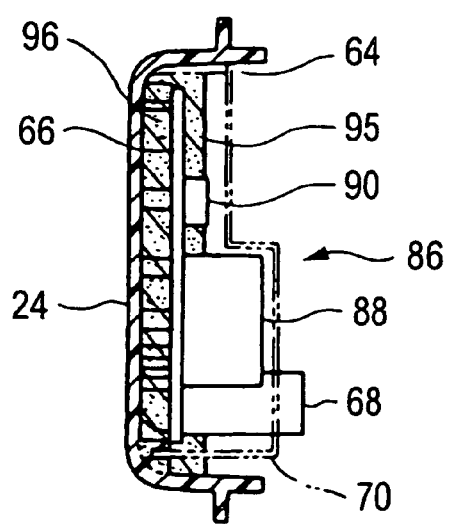
FIG. 7B is a sectional diagram showing the main portion of the rear surface cover shown in FIG. 7A.

As shown in FIG. 7A and FIG. 7B, for example, the driving circuit is configured by a switching regulator 86. Taller parts among the various kinds of parts (i.e., circuit parts) constituting the driving circuit and the parts coupled to the driving circuit (for example, a transformer (e.g., transformer for a DC/DC converter) 88, the socket 68, etc.) are disposed collectively in the area on the rear side of the reflector 44 together with the connector 72, the lead wires 74, 76, 78, 80 etc. In contrast, shorter parts different from the tall parts, (for example, a transistor (MOSFET) 90, a resistor 92, a surface mount type capacitor 94, etc.) are disposed mainly in the area on the rear side of the fixing portions 220, 222 of the reflectors 28, 44.

That is, since the reflection-type lamp unit 18 has a shorter depth than the projector-type lamp unit 14, the area on the rear surface side of the reflector 44 is vacant. Thus, the taller parts (the transformer 88 and the socket 68) are collectively disposed in this vacant area, whereby the length of the rear face cover 24 in the axial direction thereof can be made short. As a result, the entire depth of the lamp can be made short, and so the miniaturization of the lamp can be realized.

Further, since the various kinds of parts (the transformer 88, the transistor 90, the resistor 92, the surface mount type capacitor 94 etc.) constituting the driving circuit are fixed by the resin 96, it is possible to prevent such a phenomenon from occurring that the various kinds of parts are damaged or degraded by the vibration. Further, the heat generated from the various kinds of parts is effectively radiated to the rear face cover 24 and the lamp body 22 via the resin 96 and so the reliability of the driving circuit can be enhanced.

Further, since the rear face cover 24 made of metal is integrally coupled to the lamp body 22 made of metal to form the electromagnetic shielding, the electromagnetic noise generated from the driving circuit can be suppressed from leaking outside. Furthermore, since the surface of the extension 50 coupled to the lamp body 22 is deposited with aluminum, the extension 50 also forms the electromagnetic shielding together with the rear face cover 24 made of metal and the lamp body 22 made of metal thereby to suppress the electromagnetic noise generated from the driving circuit from leaking outside.

In the case of using the vehicle lamp 10 according to the exemplary embodiment as a headlamp for a head light or an adverse weather lamp, a cowl cover 100 can be fixed to a vehicle body frame 104 via a rubber 102. For example, as shown in FIG. 4, the vehicle lamp 10 is disposed on the rear surface side of the cowl cover 100. When the driving circuit is driven in response to the operation of a driver thereby to lighten the LEDs 12, 16, the light emitted from the LED 12 is reflected by the first reflecting surface 28a of the reflector 28, then penetrates the projection lens 32 and the front face cover 20 and is irradiated to the forward direction of the lamp. On the other hand, the light emitted from the LED 16 is reflected by the reflector 44, then penetrates the front face cover 20 and is irradiated to the forward direction of the lamp. In this case, light beam according to a predetermined light distribution pattern is irradiated in the forward direction of the lamp.

According to the exemplary embodiment, since the first reflecting surface 28a, the second reflecting surface 38a and the design portion 40 are configured as the reflection mirror unit 42 of a single part, the positional accuracy of the first reflecting surface 28a and the second reflecting surface 38a can be enhanced. Further, the light distribution efficiency can be improved and the number of the parts can be reduced.

While there has been described in connection with the exemplary embodiment of the present invention, it will be obvious to those skilled in the art that various changes and modification may be made therein without departing from the present invention, and it is aimed, therefore, to cover in the appended claim all such changes and modifications as fall within the true spirit and scope of the present invention.

What is claimed is:

1. A projector-type lamp unit for a vehicle, comprising:
a semiconductor light emitting element as a light source;
a first reflecting surface, which reflects and condenses a light emitted from the light source toward a projection lens disposed in a forward direction from the light source;
a second reflecting surface which reflects a part of the light reflected from the first reflecting surface toward the projection lens; and
a design portion disposed between the second reflecting surface and the projection lens and connected to the second reflecting surface, wherein:
a boundary portion between the second reflecting surface and the design portion is formed in a shape so as to have a predetermined cut-off line in a light distribution pattern of the vehicle lamp,
the first reflecting surface, the second reflecting surface, the boundary portion, and the design portion together form a one-piece structure,
the projection lens is fixed to the one-piece structure,
the first reflecting surface is formed in an elliptic shape having a first focal point near the semiconductor light emitting element and a second focal point near the boundary portion, and the first reflecting surface reflects and converges the light emitted from the semiconductor light emitting element toward the second focal point, and the design portion is disposed along an inclined downward direction from the boundary portion.

2. The projector-type lamp unit for a vehicle according to claim 1, wherein the projection lens is formed substantially in a hemisphere shape, and the design portion is formed in a half-pipe shape adjacent to and along a reflected light path from the first reflecting surface to an outer peripheral line of the projection lens.

3. The projector-type lamp unit for a vehicle according to claim 2, wherein the design portion is configured to allow the light reflected by the first reflecting surface to enter the projection lens.

4. The projector-type lamp unit for a vehicle according to claim 1, wherein the projection lens is fixed to the one-piece structure at a front end portion of the design portion.

5. The projector-type lamp unit for a vehicle according to claim 1, further comprising a heat conductive and electrically insulating board, wherein the semiconductor light emitting element is disposed on said board.

6. The projector-type lamp unit for a vehicle according to claim 1, further comprising a boundary portion between the second reflecting surface and the design portion, wherein the boundary portion serves as a shade for shielding a part of the light reflected from the first reflecting surface.

7. A vehicle lamp comprising:
a projector type lamp unit comprising:
    a semiconductor light emitting element as a light source;
    a first reflecting surface, which reflects and condenses a light emitted from the light source toward a projection lens disposed in a forward direction from the light source;
    a second reflecting surface which reflects a part of the light reflected from the first reflecting surface toward the projection lens; and
    a design portion disposed between the second reflecting surface and the projection lens and connected to the second reflecting surface,
    wherein the first reflecting surface, the second reflecting surface, and the design portion together form a one-piece structure, and
    the projection lens is fixed to the one-piece structure; and
a reflection type lamp unit comprising:
    a second light emitting element disposed beneath the first light emitting element, away from a path of the light reflected from the first reflecting surface; and
    a third reflecting surface disposed below the second semiconductor light emitting element;
    wherein the third reflecting surface is positioned on a forward side of the lamp with respect to a rear end surface of the first reflecting surface, and
    the third reflecting surface reflects a light emitted from the second light emitting element toward a region below the projection lens.

8. The vehicle lamp according to claim 7, wherein:
the first reflecting surface is formed in an elliptic shape having a first focal point near the semiconductor light emitting element and a second focal point toward which the first reflecting surface converges the light emitted from the semiconductor light emitting element, and the third reflecting surface is formed in a parabolic shape having a third focal point near the second semiconductor light emitting element.

* * * * *